United States Patent
Hu et al.

(10) Patent No.: US 9,251,891 B1
(45) Date of Patent: Feb. 2, 2016

(54) DEVICES AND METHODS TO CONDITIONALLY SEND PARAMETER VALUES TO NON-VOLATILE MEMORY

(71) Applicant: SANDISK TECHNOLOGIES INC., Plano, TX (US)

(72) Inventors: Ken Jianhui Hu, San Jose, CA (US); Nian Niles Yang, Mountain View, CA (US); Bhuvan Khurana, Milpitas, CA (US); Lee M. Gavens, Milpitas, CA (US); Kulachet Tanpairoj, Santa Clara, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/538,128

(22) Filed: Nov. 11, 2014

(51) Int. Cl.
*G11C 16/04* (2006.01)
*G11C 11/56* (2006.01)
*G11C 16/10* (2006.01)
*G11C 16/26* (2006.01)

(52) U.S. Cl.
CPC ........ *G11C 11/5642* (2013.01); *G11C 11/5628* (2013.01); *G11C 16/10* (2013.01); *G11C 16/26* (2013.01)

(58) Field of Classification Search
CPC .................... G11C 11/5628; G11C 11/5642

USPC ........................................ 365/185.03, 189.07
See application file for complete search history.

(56) References Cited

U.S. PATENT DOCUMENTS

| 8,830,717 | B2 | 9/2014 | Avila et al. | |
|---|---|---|---|---|
| 2010/0131697 | A1 | 5/2010 | Alrod et al. | |
| 2010/0202199 | A1* | 8/2010 | Guterman | G11C 16/349 365/185.03 |
| 2013/0205085 | A1 | 8/2013 | Hyun et al. | |

OTHER PUBLICATIONS

Shibata, Noboru "19nm 112.8mm2 64Gb Multi-level Flash Memory with 400Mb/s/pin 1.8V Toggle Mode Interface," Flash Memory Summit 2012, Santa Clara, CA, Aug. 20-23, 2012, 30 pages.

* cited by examiner

*Primary Examiner* — Huan Hoang
(74) *Attorney, Agent, or Firm* — Toler Law Group, PC

(57) ABSTRACT

A data storage device that includes a controller and a non-volatile memory may perform a method that includes comparing, in the controller, first parameter values of a first group of parameter values to second parameter values of a second group of parameter values. The second parameter values of the second group of parameter values are associated with a scheduled non-volatile memory operation. The first parameter values correspond to parameter values that are in the non-volatile memory. The method includes sending, from the controller to the non-volatile memory, a parameter value of the second group in response to determining that the parameter value differs from a corresponding parameter value of the first group.

24 Claims, 4 Drawing Sheets

DEVICES AND METHODS TO CONDITIONALLY SEND PARAMETER VALUES TO NON-VOLATILE MEMORY

FIELD OF THE DISCLOSURE

The present disclosure is generally related to non-volatile data storage devices.

BACKGROUND

Non-volatile memory is used in data storage devices such as universal serial bus (USB) flash memory devices or removable storage cards, as well as in data storage devices in computers, servers, electronics, and telecommunications, as illustrative examples. As non-volatile memory ages with passage of time and use of the non-volatile memory, physical and/or electrical characteristics of the non-volatile memory may change as compared to a beginning-of-life condition of the non-volatile memory. Parameters such as read voltages and programming pulse lengths may be adjusted to accommodate the changing characteristics of the non-volatile memory. However, adjusting such parameters may result in the non-volatile memory storing more recent data using recent values of the parameters and also storing older data that was programmed into the non-volatile memory using older values of the parameters. Although re-configuring the non-volatile memory to read and/or write using the older parameters or the newer parameters may enhance an accuracy of data storage and retrieval, transferring sets of parameters into and out of the non-volatile memory to accommodate reading and writing of older data as well as more recent data may cause delays and may impact device read and write latency.

SUMMARY

A data storage device performs a check of parameter values prior to initiating an operation at a non-volatile memory to determine which, if any, of the parameter values are to be updated at the non-volatile memory. A local copy of control register parameters of the non-volatile memory may be stored at a controller memory to enable a controller to compare parameters to be used for a next memory operation with the local copy of the control register parameters. Based on the result of the comparison, parameters that are to be updated may be transferred to the control register of the non-volatile memory while parameters that already have the correct value in the control register are not transferred from the controller to the non-volatile memory.

In some implementations, prior to comparing the parameters, task information of successive memory operations may be compared to determine whether the successive memory operations use the same parameters, enabling the comparison of parameters to be bypassed when the task information indicates that successive memory operations use the same parameters. A determination of parameters to load into the control register can include identifying program suspend parameters to enable the non-volatile memory to perform a multi-level cell (MLC) program operation and, without updating the parameters, to perform a next operation while the MLC program operation is suspended.

DETAILED DESCRIPTION

Figure 1:
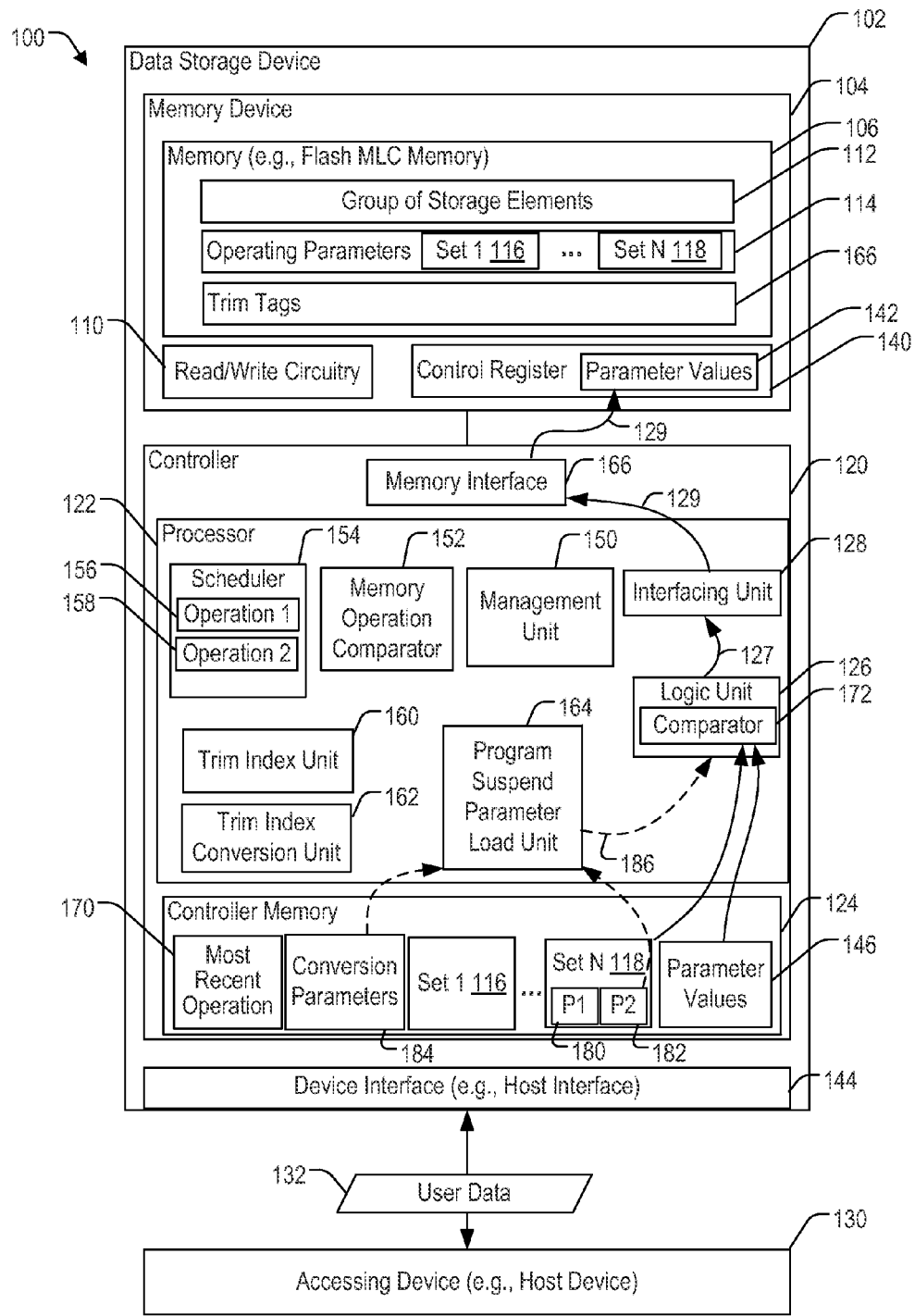
FIG. 1 is a block diagram of a particular illustrative embodiment of a system including a data storage device configured to selectively update control register parameters of a non-volatile memory.

Referring to FIG. 1, a particular embodiment of a system 100 includes a data storage device 102 coupled to an accessing device 130 (e.g., a host device) via a device interface 144 (e.g., a host interface) of the data storage device 102. The data storage device 102 has a memory device 104 (e.g., a memory die) with a control register 140 that contains parameter values 142 that can be updated by a controller 120. The controller 120 maintains information regarding the current state of the memory device 104 and selectively updates the parameter values 142. The parameter values 142 are selectively updated to reduce an amount of parameter data transfer between the controller 120 and the memory device 104. As a result of a reduced amount of parameter data transfer, delays due to parameter data transfer are reduced and average latency associated with memory operations may be improved.

The accessing device 130 may be configured to provide data to be stored at a memory 106 of the data storage device 102 or to request data to be read from the memory 106. The accessing device 130 may include a mobile telephone, a music player, a video player, a gaming console, an electronic book reader, a personal digital assistant (PDA), a computer, such as a laptop computer or notebook computer, any other electronic device, or any combination thereof. The accessing device 130 communicates via the device interface 144 to enable reading from the memory 106 and writing to the memory 106. For example, the accessing device 130 may operate in compliance with a Joint Electron Devices Engineering Council (JEDEC) industry specification, such as a Universal Flash Storage (UFS) Host Controller Interface specification. As other examples, the accessing device 130 may operate in compliance with one or more other specifications, such as a Secure Digital (SD) Host Controller specification as an illustrative example. In yet another particular embodiment, the data storage device 102 is coupled to the accessing device 130 indirectly, e.g., via a network. For example, the data storage device 102 may be a network-attached storage (NAS) device or a component (e.g. a solid-state drive (SSD) device) of a data center storage system, an enterprise storage system, or a storage area network. The accessing device 130 may communicate with the data storage device 102 in accordance with any other suitable communication protocol, as described in further detail below.

The data storage device 102 includes the memory device 104, the controller 120, and the device interface 144. The memory device 104 includes the memory 106 (e.g., a non-volatile memory such as a flash multi-level cell (MLC) memory) and circuitry, such as read/write circuitry 110, associated with operation of storage elements of the memory 106. The control register 140 contains parameter values 142 that are used by the read/write circuitry 110. In some implementations, the memory 106 may be a "two-dimensional" (2D) memory that has a planar configuration. In other implementations, the memory 106 may be a "three-dimensional" (3D) memory that has a 3D configuration, such as a 3D NAND flash memory or a vertical bit line (VBL) resistive random access memory (ReRAM), as illustrative, non-limiting examples.

The memory 106 includes a representative group of storage elements 112. For example, the group of storage elements 112 may correspond to flash MLC cells coupled to a word line. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The controller 120 is configured to receive data and instructions from and to send data to the accessing device 130 via the device interface 144. The controller 120 is further configured to send data and commands to the memory device 104 and to receive data from the memory device 104. For example, the controller 120 is configured to send data and a write command to instruct the memory device 104 to store the data to a specified address. As another example, the controller 120 is configured to send a read command to read data from a specified address of the memory 106.

The memory 106 stores operating parameters 114. The operating parameters 114 include multiple sets of operating parameters, such as a first set 116 and one or more additional sets including an Nth set 118 (where N is an integer greater than one). Each set of operating parameters 116-118 may correspond to a different configuration of the read/write circuitry 110, such as settings for one or more read voltages, program verify voltages, or other parameters. Each set of operating parameters 116-118 may be identified by an indicator, such as an index value of each set 116-118 (e.g., "1" for the first set 116 and "N" for the Nth set 118). Indicators of the particular parameter sets may be used to identify a particular parameter set to use for reading data stored to the memory 106. Indicators of the sets of operating parameters are referred to herein as "trim tags."

The memory 106 stores information corresponding to trim tags 166 for data stored at the memory 106. For example, the trim tags 166 may be stored as a table indicating, for each unit of data stored in the memory 106, a corresponding trim tag for the data. Alternatively, in other implementations, the trim tags 166 may correspond to metadata that is stored in one or more word lines or erase blocks of the memory 106 and that indicate parameter values for reading from or writing to the associated word line and/or erase block.

The control register 140 of the memory device 104 includes a set of parameter values 142. The parameter values 142 may be adjusted to set an appropriate operation of the read/write circuitry 110 based on the trim tag of the data to be read or written. For example, the controller 120 may determine a particular set of parameter values to be used for a particular memory operation (e.g., by using a current trim tag for a write operation and by using a stored trim tag corresponding to data to be read from the memory device 104). The controller 120 may send an instruction to the memory device 104 to update or overwrite all or part of the content in the control register 140 with one or more parameter values of the particular set. The control register 140 may receive the instruction and the one or more parameter values that are sent from the controller 120 and may overwrite parameter values that are in the control register 140 with the one or more parameter values that are received from the controller 120. For example, data to be read that was programmed to the memory 106 according to a single level cell (SLC) storage mode uses different read voltages as compared to data to be read from the memory 106 that was stored using a multi-level cell (MLC) storage mode. Further, data to be read that was recently written to the memory 106 may use different parameter values (e.g., higher read voltages) than data to be read that has been stored in the memory 106 for an extended period of time. Under these differing circumstances, the parameter values 142 may be updated by the controller 120 (e.g., written into the control register 140 in response to receiving an instruction from the controller 120) to provide efficient operation of the read/write circuitry 110.

The controller 120 includes a controller memory 124, a processor 122, and a memory interface 166 that is coupled to the memory device 104. The controller 120 may further be coupled to the device interface 144 to enable communication with the accessing device 130. Although the device interface 144 is illustrated as distinct from and coupled to the controller 120, in other implementations the device interface 144 may be included in the controller 120. For example, the device interface 144 may be implemented on a controller die that also includes the controller 120.

The controller memory 124 stores data including information 170 corresponding to a most recent operation and parameter values 146 corresponding to a local copy of the parameter values 142 that are stored at the control register 140. Although the controller memory 124 is illustrated as included in the controller 120, in other implementations the controller memory 124 may be distinct from and coupled to the controller 120.

The processor 122 includes a scheduler 154, a logic unit 126, an interfacing unit 128, and a management unit 150 that are adapted to enable parameter set comparisons and updates. A memory operation comparator 152 may be configured to perform a "pre-screening" of memory operations to determine whether a parameter comparison is to be performed. A trim index unit 160 and a trim index conversion unit 162 may be configured to adapt parameter values based on memory conditions (e.g., memory wear or average number of errors in read data) and to determine conversions between MLC-based parameters and SLC-based parameters. A program suspend parameter load unit 164 may be configured to pre-load parameter values for a next pending memory operation to be executed while a MLC write operation is ongoing at the memory 106.

The logic unit 126 is configured to compare a first group of parameter values stored at the controller memory 124 to a second group of parameter values associated with a scheduled memory operation. For example, the logic unit 126 may compare the parameter values 146, corresponding to a local copy of the parameter values 142 stored at the control register 140 of the memory 106, to the Nth set 118 of parameter values when the next memory operation to be performed (e.g., a first operation 156 at the scheduler 154) corresponds to the parameters in the Nth set 118. As an example, when the first operation 156 is to read data from a particular address of the memory 106, a trim tag corresponding to the data and/or corresponding to the address may be accessed by the controller 120. To illustrate, the controller 120 may retrieve, from the trim tags 166 or from a local copy of the trim tags 166 in the controller memory 124, a particular trim tag that corresponds to the particular address. The controller 120 may select a parameter set 116-118 having an index that matches the retrieved trim tag (e.g., if the retrieved trim tag is "N", the controller 120 may select the Nth set 118). As another example, when data is to be written to the memory 106, a "current" trim tag that is tracked by the trim index unit 160 may be used to select a parameter set 116-118 having an index that matches the current trim tag. A comparator 172 may compare, for each parameter, a parameter value of the first group of parameter values 146 to the corresponding parameter value of the Nth set 118 of parameter values to determine, parameter by parameter, whether values of each parameter match between the two groups (i.e., the first group of parameter values 146 ("the first group") and the Nth set 118 of parameter values ("the second group")). The logic unit 126 is configured to send an indication 127 to the interfacing unit 128 to indicate each parameter value that differs between the first group of parameter values 146 and the second group of parameter values (the Nth set 118).

The interfacing unit 128 is configured to receive the indication 127 from the logic unit 126 and to send a parameter value of the Nth set 118 to be stored in the control register 140 in response to the indication 127 indicating that the parameter value differs from a currently stored value at the control register 140. As illustrated, the interfacing unit 128 may provide one or more parameter values 129 (e.g., all non-matching parameters) to the memory interface 166. The memory interface 166 may transmit the one or more parameter values 129 to the memory device 104, such as via a bus, to be loaded into the control register 140 as updated parameter values.

By storing a local copy of the parameters 142 at the controller memory 124 as the parameter values 146, the comparison of parameter values performed by the logic unit 126 may be performed without incurring the additional latency of data transfer of parameters from the control register 140 to the controller 120. In addition, by selectively sending only parameter values to be updated from the controller 120 to the memory device 104, a latency associated with transferring updated parameters from the controller 120 to the memory device 104 may be reduced as compared to implementations in which all parameters corresponding to the scheduled operation are transmitted to the memory device 104. As a result, updates of the parameter values 142 at the control register 140 prior to initiating a memory operation may be performed with reduced delay, improving performance of the data storage device 102 and enhancing user experience.

The management unit 150 may include circuitry or logic to maintain, in the controller memory 124, a copy of the parameter values 142 that are in the control register 140 of the non-volatile memory 106 and to update contents of the controller memory 124 to indicate changes to the parameter values 142 that are in the control register 140 of the non-volatile memory 104. To illustrate, in response to the interfacing unit 128 providing the one or more parameter values 129 to the memory interface 166, the management unit 150 may receive a signal from the interfacing unit 128 that causes the management unit 150 to update values of the parameter values 146 stored in the controller memory 124. The updated parameter values in the controller memory 124 may synchronize the copy of the parameter values 146 in the controller memory 124 with the parameter values 142 in the control register 140.

The memory operation comparator 152 may be configured to compare a next scheduled memory operation (e.g. the first operation 156 at the scheduler 154) to a most recently initiated memory operation that is indicated by the most recent operation information 170 in the controller memory 124. Based on a result of the comparison, the memory operation comparator 152 may cause a parameter comparison operation at the logic circuit 126 to be bypassed. For example, when a next memory operation to be performed matches a most recently performed memory operation, such as by determining whether the operations both correspond to an MLC or SLC mode, correspond to a write operation or a read operation, and have matching trim tag values, the parameter values 142 at the control register 140 need not be updated.

To illustrate, each operation may be an MLC operation (i.e., corresponds to an MLC mode) or may be an SLC operation (i.e., corresponds to an SLC mode). When one of the memory operations corresponds to the MLC mode and the other of the memory operations corresponds to the SLC mode, one or more of the parameter values 142 are likely to require updating prior to performing the next memory operation. In addition, each operation may correspond to a read operation (i.e., to retrieve data from the memory 106) or may correspond to a write operation (i.e., to store data to the memory 106). When one of the memory operations corresponds to a read operation and the other of the memory operations corresponds to a write operation, one or more of the parameter values 142 are likely to require updating prior to performing the next memory operation. Further, each operation may be associated with a trim tag (e.g., a "current" trim tag when the memory operation corresponds to a write operation or to a read operation of recently-stored data, or another trim tag when the memory operation corresponds to a read operation of older data). When the trim tag of the next memory operation does not match the trim tag of the most recently performed memory operation, one or more of the parameter values 142 are likely to require updating prior to performing the next memory operation. Thus, when information related to successive memory operations match, a delay associated with accessing the controller memory 124 to retrieve the parameter values 118, 146 for comparison at the logic unit 126 and a delay associated with comparing the parameter values 118, 146 at the logic unit 126 may be avoided. In response to determining that the information related to the scheduled operation and to the most recently executed operation do not match, the memory operation comparator 152 may signal to the logic unit 126 that the comparison of parameter values at the logic unit 126 is to be performed.

The scheduler 154 may maintain a list of memory operations requested by the accessing device 130 or that are otherwise to be performed at the memory device 104. The scheduler 154 may include information corresponding to each pending operation, such as the first operation 156 and a second operation 158 that is to be performed following the first operation 156 at the memory 106. The scheduler 154 may further be configured to determine whether one or more operations is to be performed during a program suspend, as described in further detail herein. For example, when the first operation 156 is a MLC write (or "program") operation, the scheduler 154 may determine that the next operation to be performed (i.e., the second operation 158) may be performed during an interruption of the programming of the data during the first operation 156. To illustrate, a MLC write operation may be a relatively long operation involving multiple sequences of data transfers and program voltage applications at the memory 106. The scheduler 154 may be configured to interrupt ("program suspend") the MLC write operation in order to perform one or more other scheduled operations while the MLC write operation is suspended. Upon completion of the next operation (e.g., the second operation 158), the scheduler 154 may be configured to resume the MLC write operation (e.g., the first operation 156).

The trim index unit 160 may be configured to assign an MLC trim index indicating an MLC parameter set to blocks that are programmed with MLC data and to assign an SLC trim index indicating an SLC parameter set to blocks that are programmed with SLC data. To illustrate, the trim index unit 160 may determine a value of a trim tag 166 for SLC operations and a same or different value of a trim tag 166 for MLC operations based on an amount of wear or other "health" metric of the memory 106. Data written to the memory 106 may be accompanied by a trim tag that corresponds to a set of parameters to be used to recover the data during a read operation. The trim index unit 160 may further be configured to determine when to advance values of the trim tags 166, such as in response to determining a number of errors in data read using the current set of parameters exceeds a threshold amount. The trim index unit 160 may advance a value of the trim tag (e.g., the SLC trim tag and/or the MLC trim tag) to modify a set of parameters to read and/or write data to the memory using the newly advanced trim tag value.

The trim index unit 160 may be configured to allow multiple values of SLC trim tags and MLC trim tags to be used in the memory 106. For example, the trim index unit 160 may allow the memory 106 to continue to store data having a trim tag that is two or three versions old as compared to a current trim tag value. To illustrate, if the SLC trim tag value is "S," the trim index unit 160 may allow the memory 106 to continue to store data that was programmed using SLC trim tags "S-1," "S-2," and "S-3." However, when data stored in the memory 106 has a trim tag value that exceeds a threshold difference from a current trim tag value, the trim index unit 160 may be configured to cause the data to be rewritten to the memory 106 using a current trim tag value (e.g., SLC trim tag "S"), to improve data retention and reduce errors during data recovery at the memory 106.

The trim index conversion unit 162 may be configured to determine a set of MLC-to-SLC trim-based conversion parameters. For example, because the MLC trim tag index may advance independently of the SLC trim tag index, and because the control register 140 may have insufficient room to store a complete set of SLC parameters in addition to storing a complete set of MLC parameters, the control register 140 and the read/write circuitry 110 may be configured to store a subset of all current parameters and to perform parameter conversions between SLC parameters and MLC parameters. The trim index conversion unit 162 may be configured, in response to the trim index unit 160 advancing a trim tag index for either or both of the SLC trim tag and MLC trim tag, to compute an updated set of MLC-to-SLC trim-based conversion parameters. The updated set of MLC-to-SLC trim-based conversion parameters may be stored into the controller memory 124 as conversion parameters 184 in a parameter calculation/memory write sequence that is triggered by the trim index unit 160 advancing either or both of the SLC trim tag or the MLC trim tag. The updated set of MLC-to-SLC trim-based conversion parameters may be offset values that are computed according to:

$$DVREAD\_SLC(M)=VREAD(S)+DVREAD\_SLC(S)+DVREAD\_NEG(S)-VREAD(M)-DVREAD\_NEG(M); \qquad \text{Equation 1}$$

$$DVREADK\_SLC(M)=VREADK(S)+DVREAD\_SLC(S)+DVREADK\_SLC(S)+DVREAD\_NEG(S)-VREADK(M)-VREADK\_SLC(M)-DVREAD\_NEG(M); \text{ and} \qquad \text{Equation 2}$$

$$DVREAD\_DLA(M)=VREAD(S)+DVREAD\_DLA(S)+DVREAD\_NEG(S)-VREAD(M)-DVREAD\_NEG(M). \qquad \text{Equation 3}$$

In equations 1-3, DVREAD_SLC(M), DVREADK_SLC(M), and DVREAD_DLA(M) are examples of the MLC-to-SLC trim based conversion parameters that are offset values computed for an MLC trim tag "M" and an SLC trim tag "S" using parameter values from the MLC parameter set (e.g., VREAD(M), VREADK(M), DVREAD_NEG(M), VREAD_SLC(M), VREADK_SLC(M)) and using parameter values from the SLC parameter set (e.g., VREAD(S), VREADK(S), DVREAD_SLC(S), DVREAD_NEG(S), DVREADK_SLC(S), DVREAD_DLA(S)). DVREAD_SLC may correspond to a voltage to be applied to a word line that is two or more word lines away from a target word line during a read operation, DVREADK_SLC may correspond to a voltage to be applied to a word line that is adjacent to a target word line (e.g., a word line neighboring the target word line) during the read operation, and DVREAD_DLA may correspond to a voltage corresponding to a read operation with read-ahead read mode to determine a read value for VREAD. VREADK may correspond to a voltage applied to a word line that is adjacent to the target word line. VREAD may correspond to a voltage applied to word lines that are two or more word lines away from the target word line. DVREAD_NEG may correspond to a finer adjustment to the VREAD bias for negative sensing read operation. VREAD_SLC may correspond to an SLC read biasing condition applied to word lines that are two or more word lines away from the target word line. VREADK_SLC may correspond to an SLC read biasing condition applied to a word line that is adjacent to the target word line.

The program suspend parameter load unit 164 is configured to select a particular group of parameter values to be loaded into the control register 140 prior to initiating a scheduled MLC write operation. For example, the program suspend parameter load unit 164 may be configured to select between a first group of parameter values (e.g., conversion parameters 184) and a second group of parameter values (e.g., conversion parameters (P2) 182) and to send the selected group 186 to the logic unit 126. The logic unit 126 may send parameter values of the selected one 186 of the first group and the second group that do not match the parameter values 146 to the interfacing unit 128 to be sent to the control register 140.

The selected group of parameter values 186 is selected to enable the MLC write operation to be performed and to also enable a next scheduled operation to be performed using a common set of parameters. In some implementations, the parameter set that is retrieved for the MLC write operation can also be used for MLC read operations and SLC read operations but cannot be used for SLC write operations. In response to the first scheduled operation 156 being an MLC write operation, the program suspend parameter load unit 164 may determine whether the second scheduled operation 158 is an SLC write operation. In response to determining that the second operation 158 is an SLC write operation, the program suspend parameter load unit 164 may cause a specific set of parameters that enable the MLC write operation and the SLC write operation to be performed to be loaded to the control register 140 prior to initiating the MLC write operation of the first operation 156.

For example, when the first operation 156 is an MLC write operation, the program suspend parameter load unit 164 may determine whether parameters corresponding to the MLC write operation, such as one of the sets of parameters 116-118 in the controller memory 124, may also be used to perform the next pending operation during a program suspend. To illustrate, the memory 106 may be configured so that updates to the control register 140 are prohibited during an MLC program operation. As a result, the parameter values 142 cannot be changed in order to effect an MLC program suspend operation during an interruption of an MLC program that is ongoing at the memory 106. The parameter values associated with an MLC program operation may be sufficient to perform a MLC read operation and an SLC read operation, but may not include appropriate values to perform an SLC write operation during the program suspend.

To illustrate, the Nth set 118 of parameter values may be associated with an MLC program operation and may include first parameter values (P1) 180 that are first offset values that can be used by the read/write circuitry 110 to read MLC data and may also include conversion parameters (P2) 182 that are second offset values that can be used by the read/write circuitry 110 to convert the first parameter values 180 to values useable by the read/write circuitry 110 to read SLC data. However, the Nth set 118 of parameter values may not include parameter values or conversion parameters that enable the read/write circuitry 110 to write SLC data. Therefore, before the MLC program operation begins, the program suspend parameter load unit 164 may selectively update values of the parameters to be provided to the control register 140 based on whether the next scheduled operation is an SLC write operation. For example, the program suspend parameter load unit 164 may retrieve the Nth set 118 of parameter values and the conversion parameters 184 from the controller memory 124 and may replace the conversion parameters P2 182 (e.g., values of DVREAD_SLC, DVREADK_SLC, and DVREAD_DLA that enable conversion of MLC parameter values to SLC read parameter values) with the conversion parameters 184 (e.g., values of DVREAD_SLC, DVREADK_SLC, and DVREAD_DLA that enable conversion of MLC parameter values to SLC write parameter values). The program suspend parameter load unit 164 may send the updated set of parameter values to the logic unit 126 for comparison to the parameter values 146.

The program suspend parameter load unit 164 may therefore provide a set of parameters that enables the MLC write operation and that also enables a subsequent operation to be performed during a program suspend of the MLC write operation. Although parameter values for MLC read operations and SLC read operations may vary based on the trim tag value of the data to be read, the program suspend parameter load unit 164 may be configured to load a current set of parameter values corresponding to a current trim tag index for use in reading the SLC data or MLC data from the memory 106 (e.g., SLC trim tag "S"), effectively ignoring changes in parameter values if the data was stored using a prior trim tag value (e.g., SLC trim tag "S-1"). In case the data that is read during a program suspend using a current trim tag index is unrecoverable due to a number of errors appearing in the data, another read of the data may be scheduled to be performed using parameter values matching the trim tag index of the data to provide a more accurate read of the data with fewer bit errors.

During operation, the control register 140 stores a set of parameter values 142 associated with a recently completed memory operation. The scheduler 154 maintains a schedule of operations to be performed at the memory device 104, such as the first operation 156 and the second operation 158 in the example of FIG. 1. The memory operation comparator 152 may compare information corresponding to the first operation 156 to the most recent operation information 170 that is stored in the controller memory 124. In response to determining that information related to the next operation to be performed (i.e., the first operation 156) matches information related to the most recently completed operation as described above (e.g., matching SLC/MLC mode, matching write/read mode, matching trim tags), the memory operation comparator 152 may signal that the first operation 156 may be performed without any modification to the parameter values 142. Otherwise, the memory operation comparator 152 may signal to the logic unit 126 that one or more parameter values is likely to be different and should be checked for updated parameter values to be sent to the control register 140.

The logic unit 126 may receive the parameter values 146 (the local copy of the parameter values 142) from the controller memory 124 and may also receive a group of parameter values corresponding to the operation to be performed (i.e., the first operation 156). To illustrate, the first operation 156 may be an MLC write operation that corresponds to the Nth set 118. The logic unit 126 may compare the parameter values 146 to the parameter values of the Nth set 118 and may send the indication 127 of which parameter values (if any) differ between the two groups of parameter values. In response to no parameter values differing between the two groups, the interfacing unit 128 may signal to the memory interface 166 that no parameter values are to be updated, and the first operation 156 may be executed using the current value of the parameter values 142 in the control register 140.

However, in response to the comparator 172 indicating that one or more parameter values between the two groups of parameter values 146, 118 do not match, the indication 127 may signal to the interfacing unit 128 that one or more updated parameter values are to be provided to the control register 140. The interfacing unit 128 may provide the one or more of parameter values 129 to the memory interface 166 to be updated at the control register 140.

Prior to the comparison at the logic unit 126, if the first operation 156 is an MLC program operation, the program suspend parameter load unit 164 may modify the parameter set provided to the logic unit 126. The program suspend parameter load unit 164 may query the scheduler 154 to determine whether the second operation 158 is an SLC write operation or is an operation other than a SLC write operation. In response to determining that the second operation 158 is an SLC write operation, the program suspend parameter load unit 164 may select a particular group of parameter values to be loaded into the control register 140 to include SLC write parameters (or, as illustrated in FIG. 1, the MLC-to-SLC write conversion parameters 184) in the control register 140 upon initiation of the MLC write operation so that the SLC write operation may be performed during a program suspend of the MLC write operation. In response to determining that the second operation 158 is not an SLC write operation, the program suspend parameter load unit 164 may leave the parameter set (e.g., the Nth set 118) retrieved from the controller memory 124 unmodified because the parameter set may enable the read/write circuitry 110 to perform MLC read operations (using the first parameters 180) and SLC read operations (using the conversion parameters P2 182) during program suspend.

By comparing the parameter values 146 (the local copy of the parameter values 142 stored at the controller memory 124) to a set of parameter values to be used for a next scheduled memory operation, the logic unit 126 may determine which, if any, parameter values at the control register 140 are to be updated without the controller 120 transferring copies of the parameter values 142 from the memory device 104 to the controller 120. By selectively sending only parameter values to be updated from the controller 120 to the memory device 104, a latency associated with transferring updated parameters from the controller 120 to the memory device 104 may be reduced as compared to implementations in which all parameters corresponding to the scheduled operation are transmitted to the memory device 104. As a result, updates of the parameter values 142 at the control register 140 may be performed with reduced delay, improving performance of the data storage device 102 and enhancing user experience.

Although the processor 122 is depicted as including the logic unit 126, the interfacing unit 128, the management unit 150, the memory operation comparator 152, the scheduler 154, the trim index unit 160, the trim index conversion unit 162, and the program suspend parameter load unit 164, in other implementations, one or more of the modules of the processor 122 may be instead at least be partially implemented by dedicated circuitry and/or hardware. To illustrate, the logic unit 126 may be implemented using dedicated circuitry for enhanced speed of comparison and performance Further, in other implementations one or more modules described as executed by the processor 122 may not be included in the data storage device 102. For example, in some implementations the controller 120 may not perform MLC-to-SLC parameter conversions and therefore may not include the trim index conversion unit 162. As a second example, in some implementations the controller 120 may not pre-load parameters for program suspend execution and therefore may not include the program suspend parameter load unit 164. As a third example, in some implementations the controller 120 may not compare the most recent operation information to the next scheduled task information to determine whether to perform parameter comparisons and may instead compare parameters for each memory operation. In such implementations, the controller 120 may not include the memory operation comparator 152. As a fourth example, in some implementations the controller 120 may not compare parameters as described with respect to the logic unit 126 and may instead transfer and replace either all parameters in the control register 140 or none of the parameters in the control register 140 based on the output of the memory operations comparator 152. In such implementations, the controller 120 may not include the logic unit 126. However, each of the alternative implementations described above may provide at least some of the benefits described with respect to the illustrated embodiment.

Figure 2:
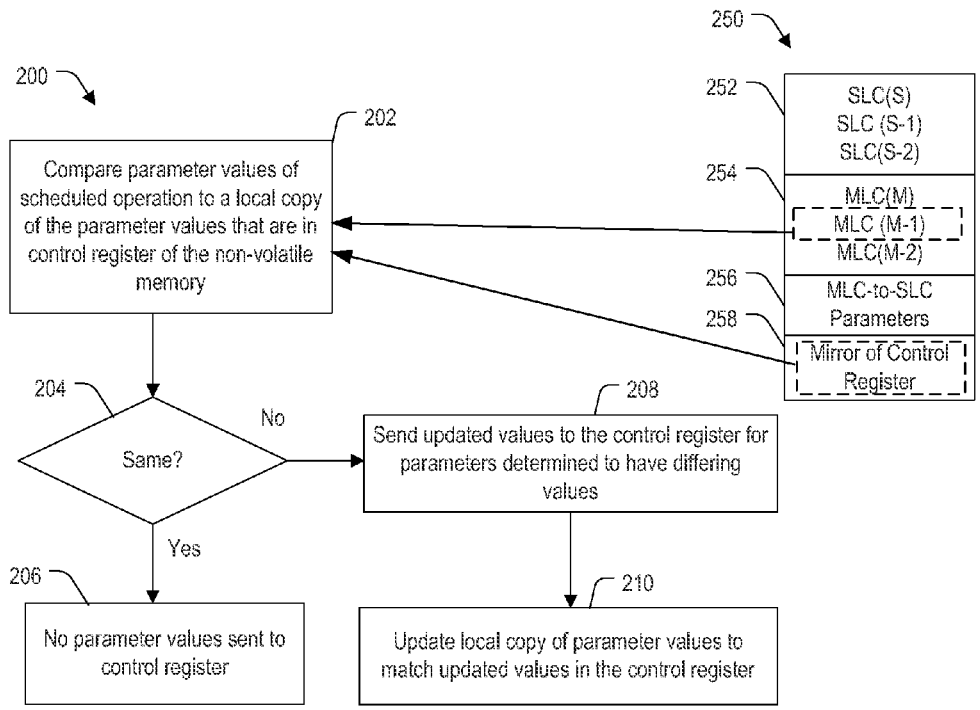
FIG. 2 is a flow chart of particular embodiment of a method that may be performed by the data storage device of FIG. 1.

Referring to FIG. 2, an illustration of an embodiment of a method of updating parameters is depicted. The method 200 includes comparing parameter values of a scheduled operation to a local copy of the parameter values that are in the control register of the non-volatile memory, at 202. For example, the logic unit 126 may compare parameter values of a scheduled operation, such as the parameters of the Nth set 118, to a local copy of the parameter values that are in the control register 140, such as the parameter values 146 that are maintained in the controller memory 124 by the management unit 150.

A memory table 250 illustrates an example of parameter data that may be included in the controller memory 124. For example, SLC parameter sets 252 may include parameters for reading and writing SLC data using a current value "S" of the SLC trim index, denoted "SLC(S)". Parameters for reading SLC data using the two prior versions of the SLC trim index "SLC(S-1)" and "SLC(S-2)" may also be included in the SLC parameter sets 252. MLC parameter sets 254 may include parameters for reading and writing MLC data using a current value "M" of the MLC trim index, denoted "MLC(M)". Parameters for reading MLC data using the two prior versions of the MLC trim index "MLC(M-1)" and "MLC(M-2)" may also be included in the MLC parameter sets 254. MLC-to-SLC conversion parameters 256 may be generated to enable conversion between MLC parameters and SLC write parameters for a current value of the MLC and SLC trim index for each memory die, such as described with respect to the conversion parameters 184 of FIG. 1. For example, in an implementation of the data storage device 102 where the memory device 104 includes 16 dies, the MLC-to-SLC parameters 256 may have a separate set of conversion parameters (e.g., a separate value of DVREAD_SLC, DVREAD_NEG, and DVREAD_DLA) for each of the 16 dies that may be used during a MLC program suspend operation. A section 258 of the memory table 250 may include a mirror of the control register 140 and may correspond to the parameter values 146 of FIG. 1.

A determination may be made whether the parameter values for the scheduled operation are the same as the local copy, at 204. In response to each parameter value for the scheduled operation matching the parameter value of the local copy of the parameter values that are in the control register 140, no parameter values are sent to the control register, at 206, and the scheduled operation may be performed using the currently stored control values at the control register 140. However, in response to at least one parameter value for the scheduled operation not matching the corresponding parameter value in the local copy of the parameter values, one or more updated values are sent to the control register 140 for the parameters determined to have differing values, at 208. For example, the logic unit 126 may send the indication 127 of a particular parameter having a value that differs between a currently stored value in the control register 140 and a value for the next scheduled operation. The interfacing unit 128 may send the value to be updated to the memory interface 166 to be forwarded to the memory 106. Each parameter value that differs between the currently stored value in the control register 140 and the value for the next scheduled operation may be indicated by the indication 127 and sent to the memory 106.

A local copy of the parameter values may be updated to match the updated values in the control register 140, at 210. For example, the management unit 150 may modify the parameter value for each updated parameter in the controller memory 124 so that the local copy of the parameter values 146 matches the parameter values 142 in the control register 140.

Figure 3:
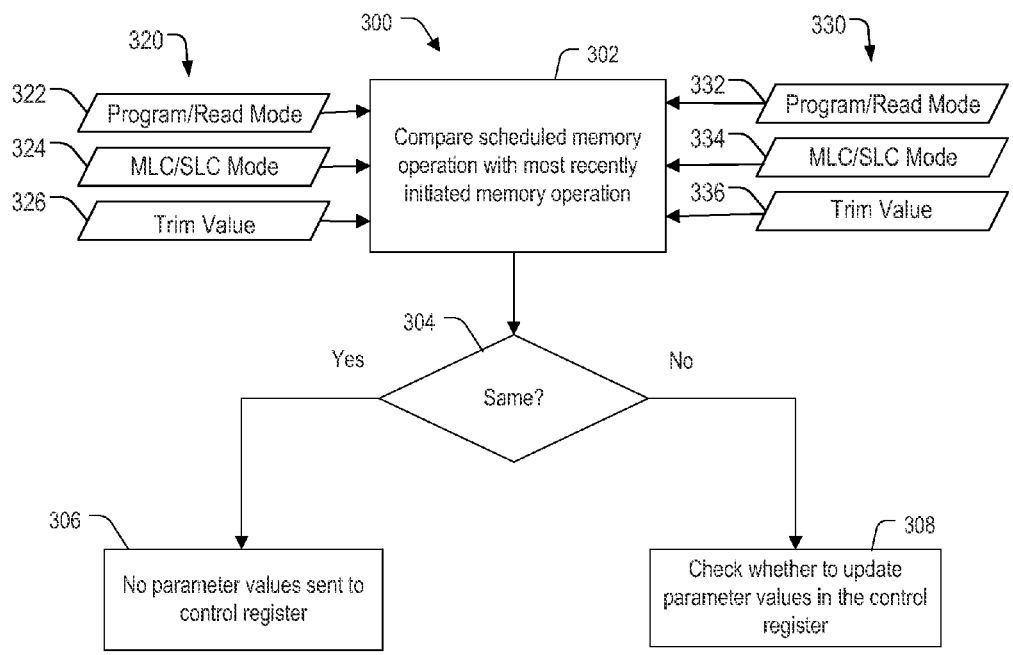
FIG. 3 is a flow chart of another particular embodiment of a method that may be performed by the data storage device of FIG. 1.

Referring to FIG. 3, another embodiment of a method 300 for updating parameters is depicted. The method 300 may be performed prior to performing the method 200 of FIG. 2. The method 300 includes comparing a scheduled memory operation to a most recently initiated memory operation, at 302. For example, the memory operation comparator 152 may compare the most recent operation information 170 with information of the first operation 156 in the scheduler 154. To illustrate, the most recent operation information 170 may include information 320 that is stored and used by the scheduler 154 and that is accessed by the memory operation comparator 152, such as a program/read mode 322, an MLC/SLC mode 324, and a trim value 326. The scheduled memory operation may include scheduled information 330 such as a program/read mode 332, an MLC/SLC mode 334, and a trim value 336. The program/read mode 322 may be compared to the program/read mode 332, the MLC/SLC mode 324 may be compared to the MLC/SLC mode 334, and the trim value 326 may be compared to the trim value 336.

In response to the information 320 matching the scheduled information 330, at 304, no parameter values are sent to the control register 140 of the memory device 104, as shown at 306. To illustrate, when the program/read mode, the MLC/

SLC mode, and the trim value between a most recently performed operation and a next operation to be performed match, current parameter values in the control register 140 are sufficient to perform the next scheduled operation, and parameter updates at the control register 140 may be bypassed.

In contrast to bypassing parameter updates when the information 320 matches the scheduled information 330, the control register 140 may be updated if at least one of the comparisons indicates a difference between the information 320 and the scheduled information 330. For example, a check may be performed to determine whether to update parameter values in the control register, at 308. To illustrate, the logic unit 126 may perform a comparison between parameter values associated with a most recently initiated memory operation with the parameter values of the next scheduled memory operation, such as described in the method 200 of FIG. 2. However, in other implementations, the parameter values 142 at the control register 140 may be updated without checking whether any of the updated parameter values match current parameter values. For example, when the information 320 does not match the scheduled information 330, the entire set of parameter values (e.g., the Nth set 118) may be automatically transferred to the memory device 104 to be loaded into the control register 140. In either implementation, the method 300 may improve average delay times and provide latency reduction by determining when successive memory operations match and therefore identifying when updating of parameter values in the control register 140 can be bypassed.

Figure 4:
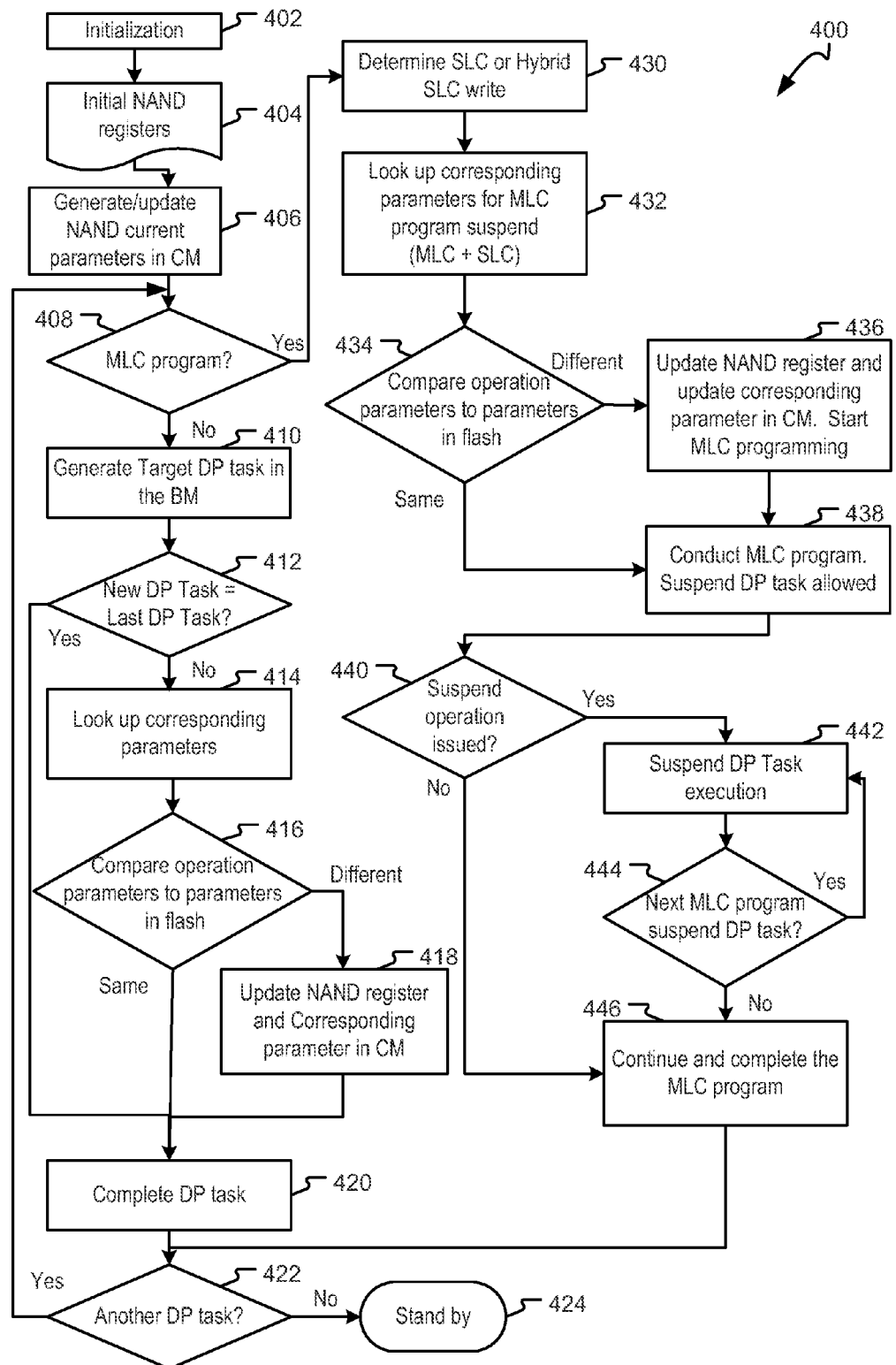
FIG. 4 is a flow chart of another particular embodiment of a method that may be performed by the data storage device of FIG. 1.

Referring to FIG. 4, a particular embodiment of a method 400 that may be performed in the data storage device 102 of FIG. 1 is depicted. The method 400 includes performing an initialization, at 402. Performing the initialization includes setting values for operation of the data storage device 102 and the memory device 104, including storing an initial set of the parameter values 142 into the control register 140 (e.g., NAND registers), at 404.

A copy of the parameter values 142 that are stored in the control register 140 (e.g., NAND current parameters) is generated and stored in the controller memory ("CM") 124, at 406.

A determination is made, at 408, whether a next scheduled operation is an MLC program operation. In response to the next operation not being an MLC program operation, task information for a target datapath ("DP") is generated in a usage balancing module ("BM"), such as the scheduler 154, at 410. For example, task information for the first operation 156 may be generated and may include information regarding whether the first operation 156 corresponds to a program mode operation or a read mode operation, whether the first operation 156 corresponds to an MLC mode operation or an SLC mode operation, and a trim value associated with a first operation 156.

A determination may be made whether the target DP task information matches the information of the last DP task, at 412. For example, the memory operation comparator 152 may compare the most recent operation information 170 to the target datapath task information for the first operation 156, such as described with respect to the method 300 of FIG. 3. In response to the task information of the most recently completed task matching the task information of the first operation 156 in the scheduler 154, no parameter values need be updated in the control register 140, and the datapath task may be completed by the controller 120 instructing the memory device 104 to perform the datapath task without updating the control register, at 420. To illustrate, an instruction may be sent from the controller 120 to the memory device 104 instructing that the first operation 156 be performed using the current value of the parameter values 142 in the control register 140.

After completing the task, at 420, a determination may be made as to whether another task is scheduled for the datapath, at 422. In response to no pending task being identified, a standby mode may be entered, at 424. If another task is identified as pending, processing may return to the MLC program operation determination, at 408.

Returning to 412, when the task information for the next task does not match the task information for the most recently completed operation, a set of parameters corresponding to the next task may be retrieved from the memory, at 414. For example, a set of parameters may be retrieved from the controller memory 124 to enable the memory device 104 to perform the first operation 156. The set of parameters may be determined using the MLC/SLC mode information and the trim tag for the first operation 156 as described with respect to FIG. 1 and FIG. 2.

A comparison may be made of the operation parameters to the parameters that are currently stored in the control register 140 of the memory device 104 (e.g. a flash device), at 416. For example, the logic unit 126 may compare the local copy of the parameter values 146 at the controller memory 124 to the parameters for the first operation 156 and may determine whether one or more parameters have values that differ between the two sets of parameters, such as described with respect to the method 200 of FIG. 2. If the parameter values are the same, the task may be completed, at 420, without updating the parameter values 142 at the control register 140. Otherwise, the control register 140 may be updated with the one or more parameter values that differ, such as by the memory device 104 receiving the one or more parameter values 129, routing the one or more parameter values 129 to a write port of the control register 140, and initiating a write operation at the control register 140 to store the one or more parameter values 129 into the control register 140. The management unit 150 may update the local copy of the parameter values 146 in the controller memory 124, at 418, such as by the management unit 150 sending the one or more parameter values 129 to a memory controller of the controller memory 124 and the memory controller initiating a write operation at the controller memory 124 to store the one or more parameter values 129 into the controller memory 124. After updating the parameter value(s) in the controller memory 124, the task may be completed, at 420.

When an MLC program instruction is to be performed, at 408, a determination may be made whether an SLC-type write operation is to be performed, at 430. For example, the program suspend parameter load unit 164 may determine whether the second operation 158 corresponds to an SLC write operation or to a hybrid SLC write operation where an MLC portion of memory is programmed with a single logical page of user data to emulate an SLC storage, such as for a binary cache operation.

The parameters for the MLC program suspend operation are determined, at 432. For example, the program suspend parameter load unit 164 may load the parameters corresponding to an MLC write operation and may further load parameters and update the retrieved parameters to match the second operation 158 to be performed during an MLC program suspend. The parameters determined by the program suspend parameter load unit 164 may be provided to the logic unit 126 to be compared to the parameters in the control register 142 (via comparison to the local copy 146 of the parameter values in the controller memory 124), at 434.

In response to one or more parameters differing between the parameter values determined by the program suspend parameter load unit 164 and the local copy of the parameter values 146, the parameter values 142 may be updated at the control register 140 and also at the local copy 146 in the controller memory 124, at 436. After updating the values at the control register 140, or in response to determining that the determined parameters match the local copy of the parameter values 146, at 434, MLC programming commences at the memory device 104 and the memory device 104 is configured to allow suspension of the MLC write operation, at 438. The memory device 104 may be configured to enable one or more tasks to be performed during suspension of the MLC write operation.

A determination is made whether a suspend operation has issued, at 440. If no suspend operation is issued, the MLC write operation continues to completion, at 446. Otherwise, the MLC write operation is suspended and the next scheduled task is performed during the MLC program suspend, at 442. For example, the second operation 158 may be performed while the first operation 156 is suspended at the memory device 104.

A determination is made whether a next MLC program suspend task is scheduled to be performed, at 444. If a next MLC program suspend task is scheduled to be performed, the next MLC program suspend task is executed, at 442, and processing continues until all scheduled MLC program suspend tasks have been processed. Upon determining that no MLC program suspend task is pending, the MLC program execution continues to completion, at 446. Processing advances to determine whether another task is pending, at 422, and entering the standby mode when no other task is pending, at 424, or returning to the MLC program determination decision, at 408, when another task is pending.

The method 400 therefore enables reduction of latency associated with updating parameters in the control register 140 of FIG. 1. For example, the task comparison at 410 enables parameter comparisons to be selectively bypassed, such as described with respect to FIG. 3. The parameter comparisons at 416 and 434 enable latency to be reduced by reducing the amount of parameter transfer from the controller 120 to the memory device 104, such as described with respect to FIG. 2. In addition, looking up the parameters for MLC program suspend at 432 increases a likelihood that a next pending operation can be performed during a program suspend without requiring modifications to the parameters at the control register 140.

Figure 5:
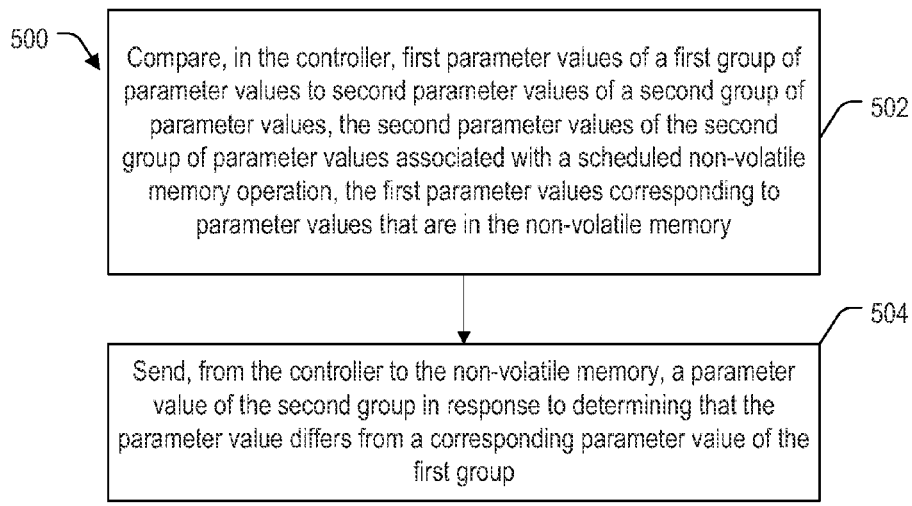
FIG. 5 is a flow chart of another particular embodiment of a method that may be performed by the data storage device of FIG. 1.

Referring to FIG. 5, a flow chart of a method 500 that may be performed in a data storage device that includes a controller and a non-volatile memory is depicted. For example, the method 500 may be performed at the data storage device 102 of FIG. 1. The method 500 includes comparing, in the controller, first parameter values of a first group of parameter values to second parameter values of a second group of parameter values, at 502. The second parameter values of the second group of parameter values are associated with a scheduled non-volatile memory operation. The first parameter values correspond to parameter values that are in the non-volatile memory. For example, the second group of parameters may correspond to the Nth set 118 that is compared to the stored parameters 146 by the logic unit 126 at the controller 120 of FIG. 1. The controller 120 may access the first group of parameter values from the controller memory 124, and the first group of parameter values (e.g., the stored parameters 146) match parameter values that are in the control register 140 of the non-volatile memory 106.

The method 500 includes sending, from the controller to the non-volatile memory, a parameter value of the second group in response to determining that the parameter value differs from a corresponding parameter value of the first group, at 504. For example, the one or more parameters 129 may be sent to the memory 106 based on the comparison at the logic unit 126.

The controller memory may be updated to store the second group of parameter values. For example, the management unit 150 may update the parameter values 146 to match contents of the control register 140 after the one or more parameter values 129 are sent to the control register 140.

Prior to comparing the second parameter values to the first parameter values, information related to the scheduled non-volatile memory operation may be compared to information related to a most recently initiated non-volatile memory operation, as described with reference to the memory operation comparator 152. For example, comparing the information related to the scheduled non-volatile memory operation to the information related to the most recently initiated non-volatile memory operation may include comparing a program/read mode, a multi-bits-per-cell (MLC)/single bit-per-cell (SLC) mode, and a trim parameter value of the scheduled non-volatile memory operation (e.g., the scheduled information 330 of FIG. 3) to a program/read mode, a MLC/SLC mode, and a trim parameter value of the most recently initiated non-volatile memory operation (e.g., the information 320 of FIG. 3). The second parameter values may be compared to the first parameter values in response to the scheduled non-volatile memory operation differing from the most recently initiated non-volatile memory operation, such as described with respect to the method 00 of FIG. 2.

By comparing parameter values to be used with a memory operation with a local copy at the controller of parameter values that are in the control register of the non-volatile memory, a reduced amount of parameter data may be transferred between the controller and the non-volatile memory. For example, the local copy of the parameter values at the controller enables the comparison to be performed without first reading the parameter values from the control register and transferring the parameter values to the controller. As another example, by sending parameter values to be updated in the control register without sending parameter values that match the contents of the control register, a reduced amount of parameter data may be sent to the non-volatile memory and a delay associated with the transfer of parameter data may be reduced or eliminated.

Figure 6:
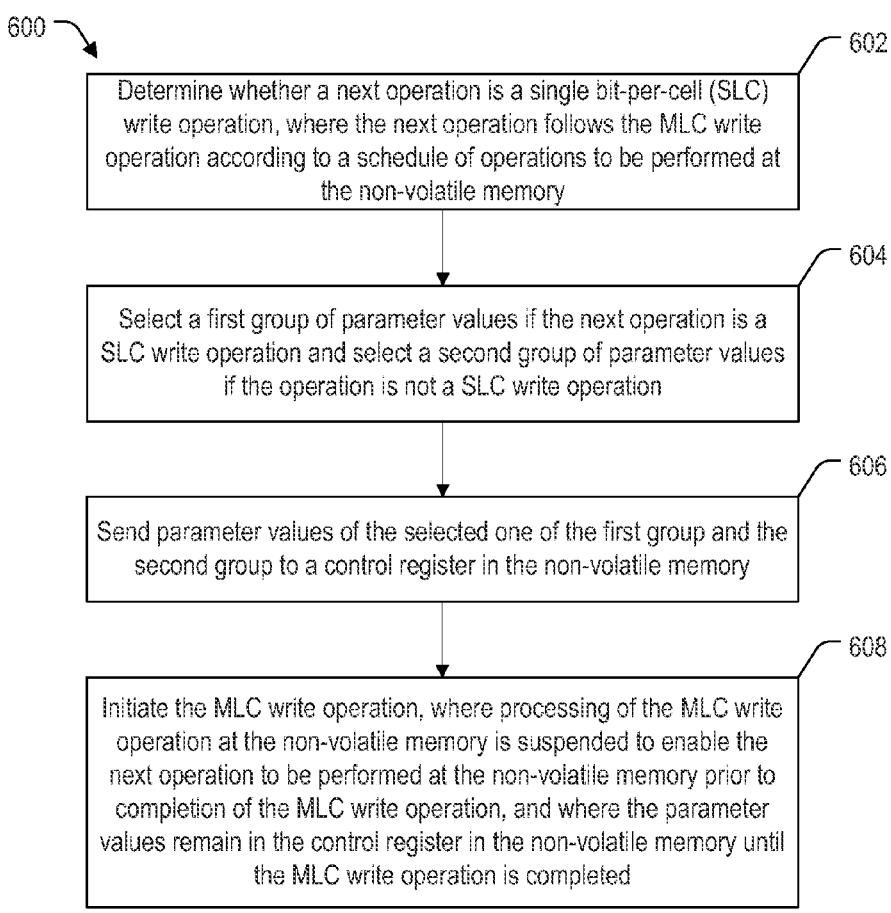
FIG. 6 is a flow chart of another particular embodiment of a method that may be performed by the data storage device of FIG. 1.

Referring to FIG. 6, a flow chart of a method 600 that may be performed in a data storage device that includes a controller and a non-volatile memory is depicted. For example, the method 600 may be performed at the data storage device 102 of FIG. 1 in response to receiving a multi-bit-per-cell (MLC) write operation to be performed at the non-volatile memory 106.

The method 600 includes determining whether a next operation is a single bit-per-cell (SLC) write operation, at 602. For example, the MLC write operation may be the first operation 156 and the next operation may be the second operation 158 that follows the MLC write operation according to a schedule of operations at the scheduler 154 that are to be performed at the non-volatile memory.

A first group of parameter values are selected if the next operation is a SLC write operation and a second group of parameter values are selected if the next operation is not a SLC write operation, at 604. For example, the first group may correspond to MLC-to-SLC write conversion parameters, such as the MLC-to-SLC write conversion parameters 184 of FIG. 1 or the MLC-to-SLC parameters 256 of FIG. 2, and the second group may correspond to parameters received with regard to the MLC write operation (e.g., the conversion parameters (P2) 182 of the Nth set 118), such as described with respect to the program suspend parameter load unit 164.

Parameter values of the selected one of the first group and the second group are sent to a control register in the non-volatile memory, such as the control register 140, at 606, and the MLC write operation, is initiated, at 608. Processing of the MLC write operation at the non-volatile memory is suspended to enable the next operation to be performed at the non-volatile memory prior to completion of the MLC write operation. The parameter values remain in the control register in the non-volatile memory until the MLC write operation is completed.

For example, the first group of parameter values may include parameter values corresponding to the MLC write operation and parameter values corresponding to the SLC write operation. The second group of parameter values may include the parameter values corresponding to the MLC write operation and parameter values corresponding to read operations. The parameter values corresponding to read operations may include first offset values to convert MLC parameter values to SLC read parameter values. The parameter values corresponding to the SLC write operation may include second offset values to convert the MLC parameter values to SLC write parameter values.

The controller may assign an MLC trim index indicating a set of MLC trim parameters to blocks programmed with MLC data and may assign an SLC trim index indicating a set of SLC trim parameter to blocks programmed with SLC data, such as described with respect to the trim index unit 160. The controller may determine a set of MLC-to-SLC trim-based conversion parameters, such as described with respect to the trim index conversion unit 162. The first group of parameter values and the second group of parameter values may include the set of MLC-to-SLC trim-based conversion parameters.

The controller may update values of the set of MLC-to-SLC trim-based conversion parameters in response to a change in one or both of the MLC trim index or the SLC trim index. The controller may store the updated values of the MLC-to-SLC trim-based conversion parameters in a controller memory, such as in the controller memory 124 as the MLC-to-SLC parameters 256 of FIG. 2. The set of MLC-to-SLC trim-based conversion parameters may correspond to current values of the MLC trim index and the SLC trim index and may be used during MLC program suspend operations to read SLC data having a current version of the SLC trim index or having a prior version of multiple prior versions of the SLC trim index.

Prior to sending the parameter values of the selected one of the first group and the second group to the control register in the non-volatile memory, the controller may compare the parameter values of the selected one of the first group and the second group to parameter values in a controller memory, such as described with respect to decision 434 of FIG. 4. The parameter values in the controller memory duplicate parameter values that are in the control register in the non-volatile memory, and the controller (e.g., the logic unit 126 and/or the interfacing unit 128) selects which parameter values to send to the control register in the non-volatile memory based on the comparison.

By selecting parameters to be loaded into the control register of the non-volatile memory based on a next scheduled operation when a MLC write operation is to be performed, the method 600 enables both the MLC write operation and the next operation to be performed using a common set of parameter values in the control register. As a result, the method 600 enables devices that do not allow modifications to the contents of the control register during program suspend to improve operating efficiency by avoiding delays associated with not being able to perform program suspend tasks.

Although various components depicted herein are illustrated as block components and described in general terms, such components may include one or more microprocessors, state machines, or other circuits configured to enable the controller 120 of FIG. 1 to selectively update parameter values of the control register 140. For example, the logic unit 126 may represent physical components, such as hardware controllers, state machines, logic circuits, or other structures, to enable comparison of multiple groups of parameter values and to generate the indicator 127 based on the comparison.

Functions described with respect to the controller 120 may be implemented using a microprocessor or microcontroller programmed to perform the described functions. For example, the logic unit 126 may be implemented by a microprocessor executing program instructions to retrieve the parameter values 146 from the controller memory and to retrieve another identified set of parameters from the memory, and for each parameter of the sets, to compare a value of the parameter from the parameter values to a value of the parameter in the identified set of parameters. The logic unit may generate an indication of each parameter value that does not match, such as by generating a list or other data structure (e.g., a bitmap) indicating which parameters or which memory locations in the controller memory 124 are to be updated. In a particular embodiment, the controller 120 includes the processor 122 that executes instructions that are stored at the non-volatile memory 104. Alternatively, or in addition, executable instructions that are executed by the processor 122 may be stored at a separate memory that is not part of the non-volatile memory 104, such as at a read-only memory (ROM).

The data storage device 102 may include one or more semiconductor memory devices. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the scope of the disclosure as described herein and as understood by one of skill in the art.

Aspects of the memory system described with respect to the data storage device 102 of FIG. 1, the flowcharts of FIGS. 2-6, or any combination thereof, may be implemented in various types of devices, such as computers, servers, telecommunication devices, or other electronics, as illustrative, non-limiting examples. As a non-limiting example, the data storage device 102 may be implemented in a portable device configured to be selectively coupled to one or more external devices. To illustrate, the data storage device 102 may be coupled to a packaged apparatus such as a wireless telephone, a personal digital assistant (PDA), a gaming device or console, a portable navigation device, or other device that uses internal non-volatile memory. In a particular embodiment, the data storage device 102 may include a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device including a controller and a non-volatile memory, performing:
   comparing, in the controller, first parameter values of a first group of parameter values to second parameter values of a second group of parameter values, the second parameter values of the second group of parameter values associated with a scheduled non-volatile memory operation, the first parameter values corresponding to parameter values that are at the non-volatile memory; and
   sending, from the controller to the non-volatile memory, a parameter value of the second group in response to determining that the parameter value differs from a corresponding parameter value of the first group.

2. The method of claim 1, wherein the controller accesses the first group of parameter values from a controller memory and wherein the first group of parameter values matches parameter values that are stored in a control register of the non-volatile memory.

3. The method of claim 2, further comprising updating the controller memory to store the second group of parameter values, wherein the second group of parameter values duplicates contents of the control register of the non-volatile memory after sending the parameter value of the second group to the control register of the non-volatile memory.

4. The method of claim 1, further comprising, prior to comparing the second parameter value to the first parameter values, comparing information related to the scheduled non-volatile memory operation to information related to a most recently initiated non-volatile memory operation, and wherein the second parameter values are compared to the first parameter values in response to the information related to the scheduled non-volatile memory operation differing from the information related to the most recently initiated non-volatile memory operation.

5. The method of claim 4, wherein comparing the information related to the scheduled non-volatile memory operation to the information related to the most recently initiated non-volatile memory operation includes comparing a program/read mode, a multi-bits-per-cell (MLC)/single bit-per-cell (SLC) mode, and a trim parameter value of the scheduled non-volatile memory operation to a program/read mode, a MLC/SLC mode, and a trim parameter value of the most recently initiated non-volatile memory operation.

6. A method comprising:
   in a data storage device including a controller and a non-volatile memory, performing in response to receiving a multi-bit-per-cell (MLC) write operation to be performed at the non-volatile memory:
   determining whether a next operation is a single bit-per-cell (SLC) write operation, wherein the next operation follows the MLC write operation according to a schedule of operations to be performed at the non-volatile memory;
   selecting a first group of parameter values if the next operation is a SLC write operation and selecting a second group of parameter values if the next operation is not a SLC write operation;
   sending parameter values of the selected one of the first group and the second group to a control register in the non-volatile memory; and
   initiating the MLC write operation,
   wherein processing of the MLC write operation at the non-volatile memory is suspended to enable the next operation to be performed at the non-volatile memory prior to completion of the MLC write operation, and wherein the parameter values remain in the control register in the non-volatile memory until the MLC write operation is completed.

7. The method of claim 6, wherein the first group of parameter values includes parameter values corresponding to the MLC write operation and parameter values corresponding to the SLC write operation, and wherein the second group of parameter values includes the parameter values corresponding to the MLC write operation and parameter values corresponding to read operations.

8. The method of claim 7, wherein the parameter values corresponding to read operations include first offset values to convert MLC parameter values to SLC read parameter values and wherein the parameter values corresponding to the SLC write operation include second offset values to convert the MLC parameter values to SLC write parameter values.

9. The method of claim 6, wherein the controller determines an MLC trim index indicating a set of MLC trim parameters and an SLC trim index indicating a set of SLC trim parameter, wherein the controller determines a set of MLC-to-SLC trim-based conversion parameters, and wherein the first group of parameter values and the second group of parameter values include the set of MLC-to-SLC trim-based conversion parameters.

10. The method of claim 9, wherein the controller updates values of the set of MLC-to-SLC trim-based conversion parameters in response to a change in one or both of the MLC trim index or the SLC trim index, and wherein the controller stores the updated values of the MLC-to-SLC trim-based conversion parameters in a controller memory.

11. The method of claim 9, wherein the set of MLC-to-SLC trim-based conversion parameters corresponds to current values of the MLC trim index and the SLC trim index and is used during MLC program suspend operations to read SLC data having a current version of the SLC trim index or having a prior version of multiple prior versions of the SLC trim index.

12. The method of claim 6, wherein prior to sending the parameter values of the selected one of the first group and the second group to the control register in the non-volatile memory, the controller compares the parameter values of the selected one of the first group and the second group to parameter values in a controller memory, wherein the parameter values in the controller memory duplicate parameter values that are in the control register in the non-volatile memory, and the controller selects which parameter values to send to the control register in the non-volatile memory based on the comparison.

13. A data storage device comprising:
   a non-volatile memory; and
   a controller coupled to the non-volatile memory, wherein the controller includes:

a logic unit configured to compare a first group of parameter values stored at a controller memory to a second group of parameter values associated with a scheduled memory operation, wherein the first group of parameter values corresponds to parameter values that are in the non-volatile memory; and an interfacing unit configured to send a parameter value of the second group to the non-volatile memory in response to an indication from the logic unit that the parameter value differs from a corresponding parameter value of the first group.

14. The data storage device of claim 13, wherein the controller memory comprises a memory that is accessible to the controller and that is configured to store multiple groups of parameter values including the first group of parameter values and the second group of parameter values.

15. The data storage device of claim 13, wherein the controller includes a management unit configured to maintain, in the controller memory, a copy of parameter values that are stored in the control register of the non-volatile memory and to update contents of the controller memory to indicate changes to parameter values in the control register of the non-volatile memory.

16. The data storage device of claim 13, wherein the controller includes a non-volatile memory operation comparator configured to compare information related to the scheduled memory operation to information related to a most recently initiated memory operation, and wherein the controller is further configured to bypass the comparison of the first group of parameter values to the second group of parameter values in response to the memory operation comparator indicating that the information related to the scheduled memory operation matches the information related to the most recently initiated memory operation.

17. The data storage device of claim 16, wherein the non-volatile memory operation comparator of the controller is configured to compare a program/read mode, a multi-bits-per-cell (MLC)/single bit-per-cell (SLC) mode, and a trim parameter value of the scheduled memory operation to a program/read mode, a MLC/SLC mode, and a trim parameter value of the most recently initiated memory operation to determine whether the scheduled memory operation matches the most recently initiated memory operation.

18. A data storage device comprising:
a non-volatile memory including a control register, wherein the non-volatile memory is configured to support a multi-bit-per-cell (MLC) mode and a single bit-per-cell (SLC) mode, wherein the non-volatile memory is further configured to support a program suspend mode, and wherein in the program suspend mode, the non-volatile memory is configured to suspend an MLC write operation to perform a second memory operation while the MLC write operation is suspended and to resume the MLC write operation after the second memory operation has been performed; and
a controller coupled to the non-volatile memory, wherein the controller includes an MLC program suspend parameter load unit, wherein in response to a scheduled MLC write operation being followed by a next operation according to a schedule of operations to be performed at the non-volatile memory, the MLC program suspend parameter load unit is configured to select one of a first group of parameter values or a second group of parameter values to be loaded into the control register of the non-volatile memory, and wherein the MLC program suspend parameter load unit is configured to select the one of the first group of parameter values or the second group of parameter values prior to initiating the scheduled MLC write operation and based on whether the next operation is a SLC write operation.

19. The data storage device of claim 18, wherein selection of the first group or the second group enables the next operation to be performed at the non-volatile memory in the program suspend mode, and wherein the parameter values remain unchanged in the control register of the non-volatile memory until the scheduled MLC write operation is completed.

20. The data storage device of claim 18, wherein the first group includes first offset values to enable conversion of MLC parameter values to SLC write parameter values and wherein the second group includes second offset values to enable conversion of the MLC parameter values to SLC read parameter values.

21. The data storage device of claim 18, wherein the controller includes a trim index unit that is configured to determine an MLC trim index indicating an MLC trim parameter set and to determine an SLC trim index indicating an SLC trim parameter set, wherein the controller further includes a trim index conversion unit configured to determine a set of MLC-to-SLC trim-based conversion parameters, and wherein the first group of parameter values and the second group of parameter values include the set of MLC-to-SLC trim-based conversion parameters.

22. The data storage device of claim 21, wherein the trim index conversion unit is configured to update values of the set of MLC-to-SLC trim-based conversion parameters in response to a change in one or both of the MLC trim index or the SLC trim index, and wherein the controller includes a management unit configured to store the updated values of the set of MLC-to-SLC trim-based conversion parameters in a controller memory.

23. The data storage device of claim 18, wherein the controller includes a logic unit configured to compare the parameter values of the selected one of the first group and the second group to parameter values in a controller memory to determine which parameter values to update in the control register of the non-volatile memory, wherein the parameter values in the controller memory duplicate parameter values that are stored in the control register of the non-volatile memory.

24. A memory controller device comprising:
a non-volatile memory interface;
a logic unit configured to compare a first group of parameter values stored at a controller memory to a second group of parameter values associated with a scheduled memory operation, wherein the first group of parameter values corresponds to parameter values that are stored in a control register of a non-volatile memory coupled to the non-volatile memory interface;
an interfacing unit configured to send a parameter value of the second group to the non-volatile memory in response to an indication from the logic unit that the parameter value differs from a corresponding parameter value of the first group;
a management unit configured to maintain, in the controller memory, a copy of parameter values that are stored in the control register of the non-volatile memory and to update contents of the controller memory to indicate changes to parameter values in the control register of the non-volatile memory;
a non-volatile memory operation comparator configured to compare information related to the scheduled memory operation to information related to a most recently initiated memory operation to bypass comparison at the logic unit of the first group of parameter values to the second group of parameter values in response to the information related to the memory operation comparator indicating that the scheduled memory operation matches the information related to most recently initiated memory operation;
a trim index unit configured to determine a multi-level cell (MLC) trim index indicating an MLC trim parameter set and to assign a single level cell (SLC) trim index indicating an SLC trim parameter set;
a trim index conversion unit configured to determine a set of MLC-to-SLC trim-based conversion parameters, and wherein the first group of parameter values and the second group of parameter values include the set of MLC-to-SLC trim-based conversion parameters; and
an MLC program suspend parameter load unit configured, in response a scheduled MLC write operation being followed by a next operation according to a schedule of operations to be performed at the non-volatile memory, to select a particular group of parameter values to be loaded into the control register of the non-volatile memory prior to initiating the scheduled MLC write operation and based on whether the next operation is a SLC write operation.

* * * * *